(12) United States Patent
Sambonsugi et al.

(10) Patent No.: US 8,088,666 B2
(45) Date of Patent: Jan. 3, 2012

(54) SEMICONDUCTOR DEVICE MANUFACTURE METHOD INCLUDING PROCESS OF IMPLANTING IMPURITY INTO GATE ELECTRODE INDEPENDENTLY FROM SOURCE/DRAIN AND SEMICONDUCTOR DEVICE MANUFACTURED BY THE METHOD

(75) Inventors: Yasuhiro Sambonsugi, Kawasaki (JP); Hikaru Kokura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 546 days.

(21) Appl. No.: 11/898,830

(22) Filed: Sep. 17, 2007

(65) Prior Publication Data
US 2008/0311721 A1    Dec. 18, 2008

Related U.S. Application Data

(62) Division of application No. 10/298,641, filed on Nov. 19, 2002, now Pat. No. 7,285,449.

(30) Foreign Application Priority Data

Nov. 26, 2001 (JP) .................................. 2001-358754
Oct. 29, 2002 (JP) .................................. 2002-314613

(51) Int. Cl.
*H01L 21/336* (2006.01)
(52) U.S. Cl. ................................. 438/306; 257/E21.433
(58) Field of Classification Search .......... 438/289–290, 438/299–307, 527; 257/E21.433, E21.434, 257/E21.435, E21.437
See application file for complete search history.

(56) References Cited

U.S. PATENT DOCUMENTS

| 4,735,917 | A | 4/1988 | Flatley et al. |
| 5,552,346 | A | 9/1996 | Huang et al. |
| 6,271,125 | B1 | 8/2001 | Yoo et al. |
| 6,294,415 | B1 * | 9/2001 | Tseng et al. .................. 438/197 |
| 6,340,617 | B1 * | 1/2002 | Goto .............................. 438/303 |
| 6,413,807 | B1 * | 7/2002 | Mikagi ......................... 438/198 |
| 6,423,602 | B2 | 7/2002 | Matsuda |
| 6,462,374 | B2 * | 10/2002 | Usuki et al. ................... 257/315 |
| 6,582,995 | B2 * | 6/2003 | Hsieh et al. ................... 438/143 |
| 6,599,819 | B1 | 7/2003 | Goto |

(Continued)

FOREIGN PATENT DOCUMENTS
JP    04-023439 A    1/1992
(Continued)

OTHER PUBLICATIONS

Japanese Office Action dated Dec. 26, 2006, issued in corresponding Japanese Patent Application No. 2002-314613.

*Primary Examiner* — Matthew W Such
*Assistant Examiner* — Ali Naraghi
(74) *Attorney, Agent, or Firm* — Westerman, Hattori, Daniels & Adrain, LLP

(57) ABSTRACT

A gate electrode made of semiconductor is formed on the partial surface area of a semiconductor substrate. A mask member is formed on the surface of the semiconductor substrate in an area adjacent to the gate electrode. Impurities are implanted into the gate electrode. After impurities are implanted, the mask member is removed. Source and drain regions are formed by implanting impurities into the surface layer of the semiconductor substrate on both sides of the gate electrode. It is possible to reduce variations of cross sectional shape of gate electrodes and set an impurity concentration of the gate electrode independently from an impurity concentration of the source and drain regions.

5 Claims, 15 Drawing Sheets

U.S. PATENT DOCUMENTS

| | | |
|---|---|---|
| 6,734,070 B1 | 5/2004 | Takahashi |
| 6,808,974 B2 * | 10/2004 | Park et al. ............... 438/232 |
| 2002/0008295 A1 * | 1/2002 | Yang et al. ............... 257/413 |

FOREIGN PATENT DOCUMENTS

| | | |
|---|---|---|
| JP | 05-326552 A | 12/1993 |
| JP | 07-094720 A | 4/1995 |
| JP | 07-122737 A | 5/1995 |
| JP | 09-186317 A | 7/1997 |
| JP | 09-275149 A | 10/1997 |
| JP | 2000-150880 A | 5/2000 |
| JP | 2001-297996 A | 10/2001 |

* cited by examiner

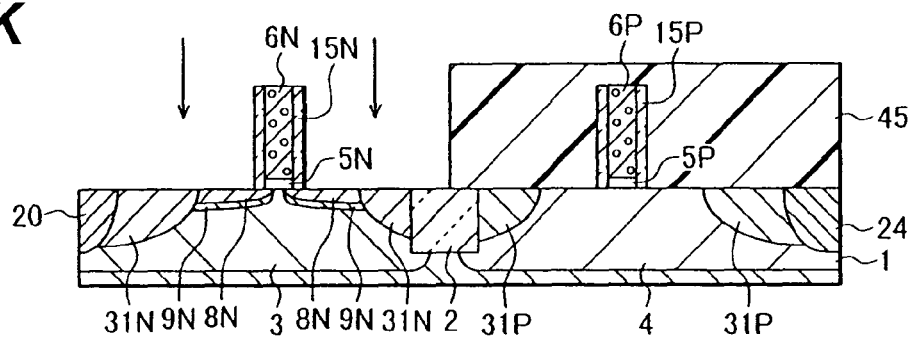
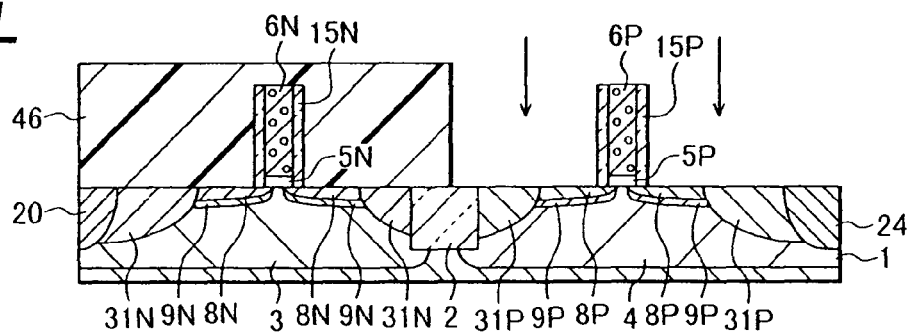
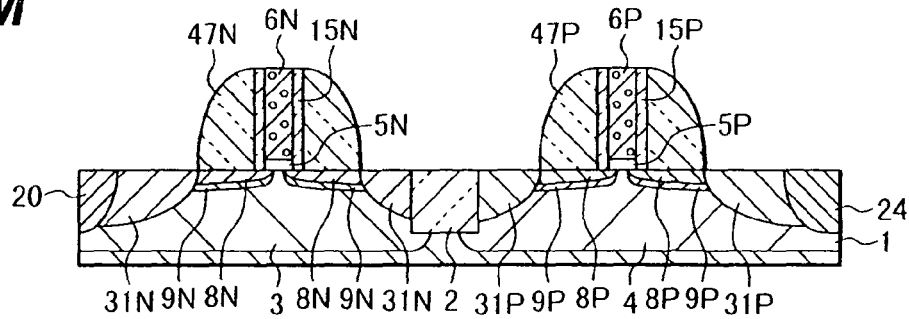
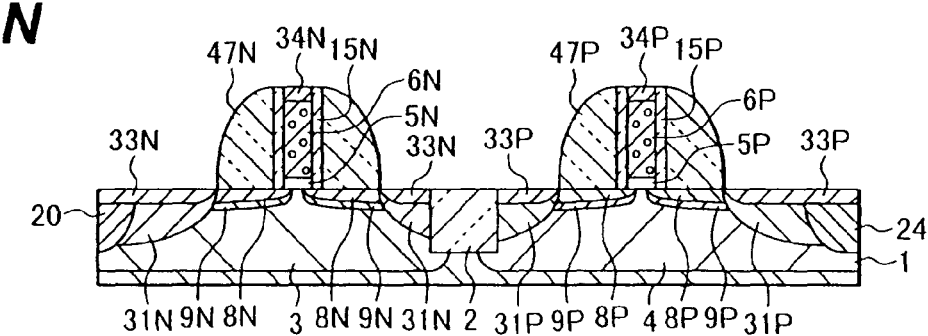

SEMICONDUCTOR DEVICE MANUFACTURE METHOD INCLUDING PROCESS OF IMPLANTING IMPURITY INTO GATE ELECTRODE INDEPENDENTLY FROM SOURCE/DRAIN AND SEMICONDUCTOR DEVICE MANUFACTURED BY THE METHOD

CROSS REFERENCE TO RELATED APPLICATION

This application is a division of U.S. patent application Ser. No. 10/298,641, filed Nov. 19, 2002 now U.S. Pat. No. 7,285,449, which is based on Japanese Patent Applications No. 2001-358754, filed on Nov. 26, 2001, and No. 2002-314613, filed Oct. 29, 2002, the entire contents of which are incorporated herein by reference.

BACKGROUND OF THE INVENTION

A) Field of the Invention

The present invention relates to a semiconductor device and its manufacture method, and more particularly to a method of manufacturing a MOS FET whose gate electrode, source and drain regions are implanted with impurities and a semiconductor device fabricated by such a method.

B) Description of the Related Art

Polysilicon or amorphous silicon is used as the material of the gate electrode of a MOSFET. Impurities are implanted into a gate electrode either by implanting p- or n-type impurities into a silicon film to be used as the gate electrode before the silicon film is patterned or by patterning a silicon film and thereafter implanting impurities into the source and drain regions and the gate electrode at the same time.

If a silicon film is patterned after impurities are implanted into the silicon film, it is difficult to control the cross sectional shape of the gate electrode.

FIG. 5A shows examples of the cross sectional shape of a gate electrode. An element separation insulating film 501 is formed in the surface layer of a silicon substrate 500. Gate electrodes 502 and 503 are formed in active regions defined by the element separation insulating film 501. The gate electrodes 502 and 503 are formed by patterning a silicon film without annealing the phosphorous (P) and boron (B) implanted areas of the silicon film.

The silicon film implanted with boron and patterned can form the gate electrode 503 having generally a rectangular shape. In contrast, the silicon film implanted with phosphorous and patterned forms the gate electrode 502 having a cross sectional shape with its middle region being constricted.

FIG. 5B is a cross sectional view of a gate electrode formed by implanting impurities into a silicon film and annealing before the film is patterned. In the area where boron was implanted, a gate electrode 503A having a rectangular cross section can be obtained, whereas in the area where phosphorous was implanted, the cross sectional shape of a gate electrode 502A is likely to have a trapezoidal shape with a bell-bottom.

Variations of the cross sectional shape raise no serious problem if a minimum processing size is relatively large. As the degree of integration becomes high, a silicon oxide film or a silicon oxynitride film formed on the surface of a gate electrode is very thin. If there are variations of the cross sectional shape of a gate electrode, it is difficult to form a very thin film with good reproducibility.

If after a silicon film is patterned, impurities are implanted into source and drain regions and a gate electrode at the same time, it is not possible to independently control the impurity concentrations of the source and drain regions and the gate electrode. In order to suppress depletion in a gate electrode, it is desired to set the dose of ion into the gate electrode, for example, to $7\times10^{15}$ cm$^{-2}$ or more.

In this case, the dose of the source and drain regions is also $7\times10^{15}$ cm$^{-2}$. As the dose of the source and drain regions is increased to the same degree as that of the gate electrode, the source and drain regions extend just under the gate electrode so that the influence of short channel effects becomes high.

SUMMARY OF THE INVENTION

An object of this invention is to provide a semiconductor device manufacturing method capable of reducing variations of the cross sectional shape of a gate electrode and setting the impurity concentration of the gate electrode independently from that of the source and drain regions.

Another object of the invention is to provide a semiconductor device manufactured by such a semiconductor device manufacturing method.

According to one aspect of the present invention, there is provided a method of manufacturing a semiconductor device, comprising: (a) a step of forming a gate electrode comprising semiconductor over a partial surface area of a semiconductor substrate; (b) a step of forming a mask member over a surface of the semiconductor substrate in an area adjacent to the gate electrode; (c) a step of implanting impurities into the gate electrode; (d) a step of removing the mask member; and (e) a step of implanting impurities into a surface layer of the semiconductor substrate on both sides of the gate electrode to form source and drain regions.

Since impurities are implanted by covering the surface of the semiconductor substrate with a mask member, the impurities can be implanted only into the gate electrode without implanting the impurities in the surface layer (source and drain regions) of the semiconductor substrate. With this method, a semiconductor device having the structure as defined in the following can be manufactured.

According to another aspect of the present invention, there is provided a semiconductor device comprising: a semiconductor substrate; a gate insulating film made of a first insulating material and formed on a partial surface area of the semiconductor substrate; a gate electrode formed on the gate insulating film; first films made of a second insulating material and covering sidewalls of the gate electrode and first areas of the semiconductor substrate continuous with the sidewalls of the gate electrode, the first films being conformal to an underlying surface; second films made of a third insulating material and covering surfaces of the first films, the second films being conformal to the surfaces of the first films; sidewall spacers made of a fourth insulating material and disposed over the second films; extension regions of a first conductivity type disposed in a surface layer of the semiconductor substrate corresponding to the first areas; source and drain regions of the first conductivity type disposed in the surface layer of the semiconductor substrate corresponding to second areas outside of the first areas relative to the gate electrode; and high impurity concentration regions having an impurity concentration higher than an impurity concentration of the source and drain regions and disposed in the surface layer of the semiconductor substrate corresponding to third areas outside of the second areas relative to the gate electrode.

According to another aspect of the present invention, there is provided a method of manufacturing a semiconductor device, comprising the steps of: (i) forming a gate electrode consisting of semiconductor over a partial surface area of a semiconductor substrate; (j) implanting impurities into a surface layer of the semiconductor substrate by using said gate electrode as a mask; (k) forming first sidewall spacers consisting of insulating material on sidewalls of said gate electrode; (l) implanting impurities into the surface layer of the semiconductor substrate by using said gate electrode and said first sidewall spacers as a mask; (m) forming second sidewall spacers consisting of insulating material on sidewalls of said first sidewall spacers; (n) implanting impurities into said gate electrode; and (o) performing a heat treatment to activate the implanted impurities.

Impurities can be implanted into the gate electrode without implanting the extension regions, source and drain regions below the first and the second sidewall spacers because the first and the second sidewall spacers are formed on the sidewall of the gate electrode.

According to a further aspect of the present invention, there is provided a semiconductor device comprising: a semiconductor substrate; a gate insulating film consisting of first insulating material formed on a partial surface area of said semiconductor substrate; a gate electrode formed on said gate insulating film; impurity diffusion regions formed in a surface layer of said semiconductor substrate on both sides of said gate electrode, each of said impurity diffusion regions including a first region, a second region deeper than the first region, and a third region deeper than the second region in this order from said gate electrode; sidewall spacers formed on sidewalls of said gate electrode and reaching halfway an upper surface of the second region; and a metal silicide film formed on an upper surface of the second region not covered with said sidewall spacer and on a surface of the third region.

As above, prior to implanting impurities into a semiconductor layer, a gate electrode is patterned. It is therefore possible to reduce variations of the cross sectional shape of a gate electrode.

DESCRIPTION OF THE PREFERRED EMBODIMENTS

Figure 1A:
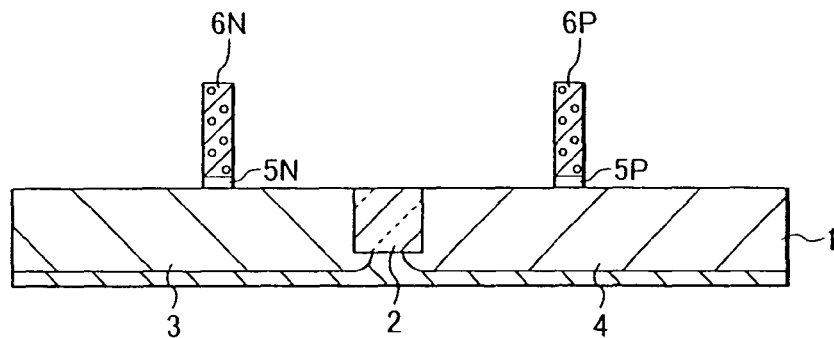
FIGS. 1A to 1O are cross sectional views of a substrate illustrating a semiconductor device manufacturing method according to a first embodiment of the invention.
Figure 1B:
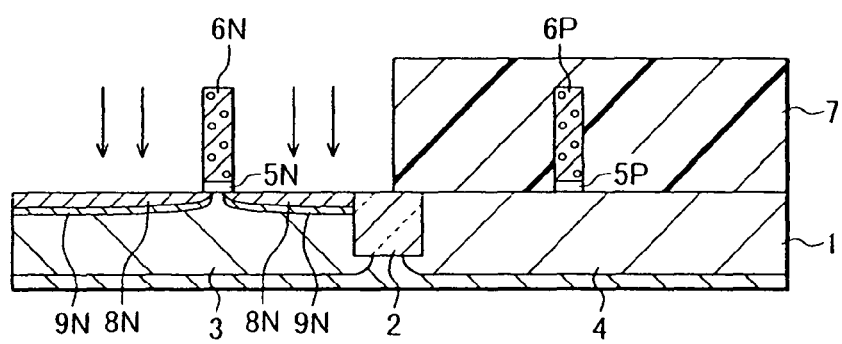
Figure 1C:
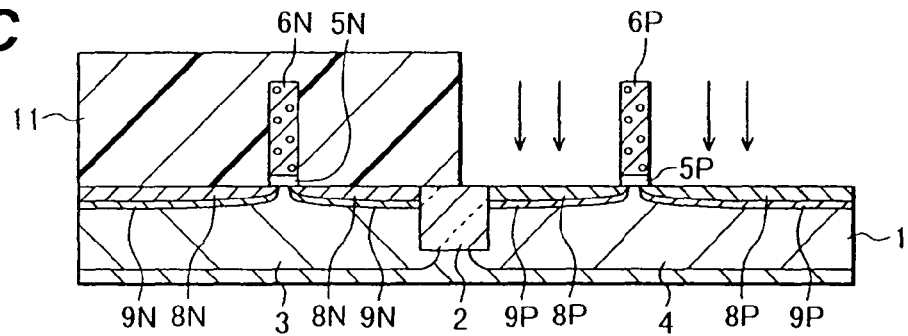
Figure 1D:
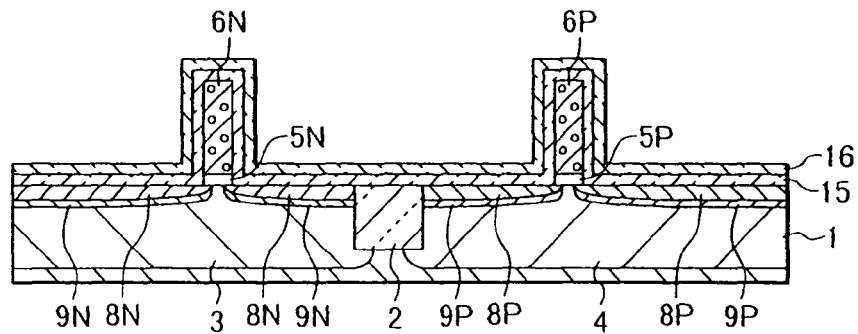
Figure 1E:
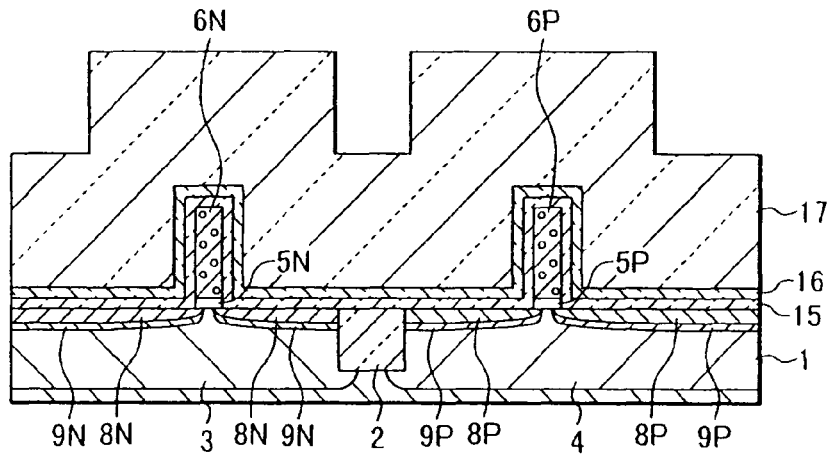
Figure 1F:
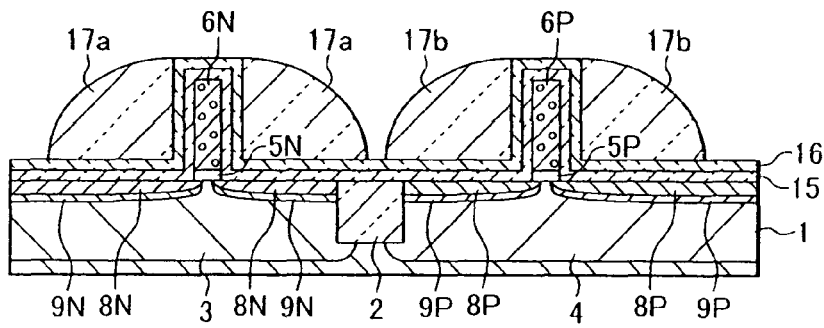
Figure 1G:
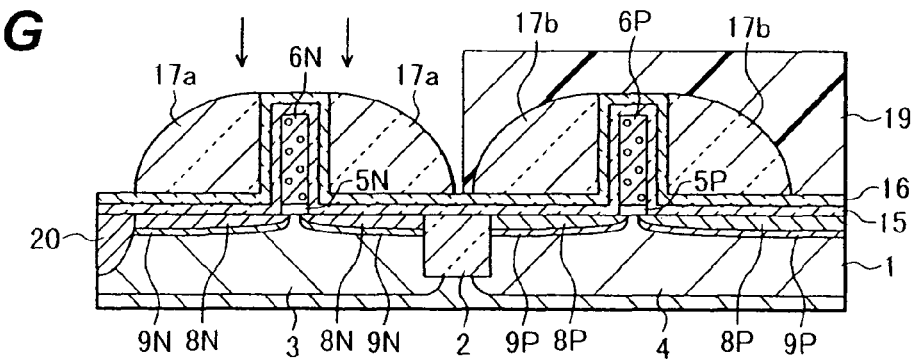
Figure 1H:
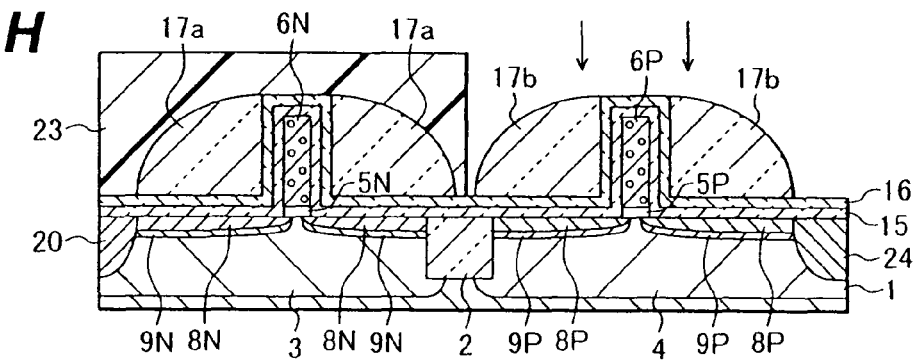
Figure 1I:
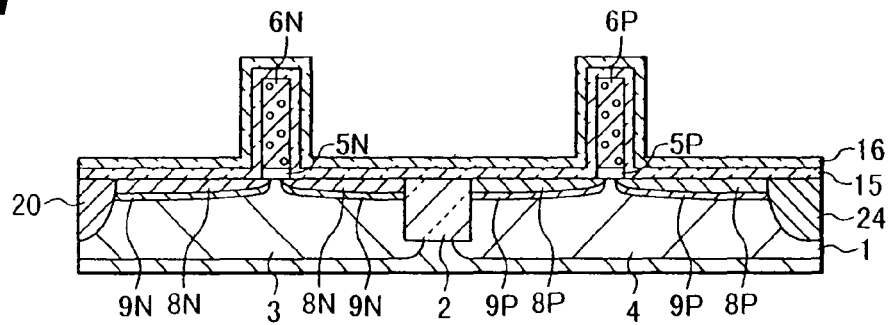
Figure 1J:
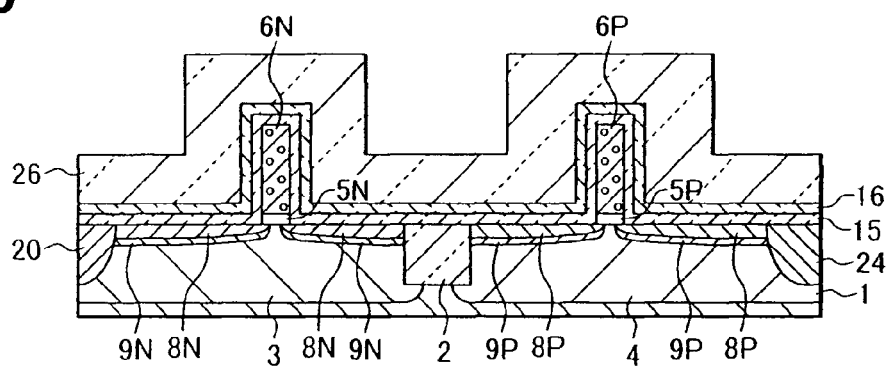
Figure 1K:
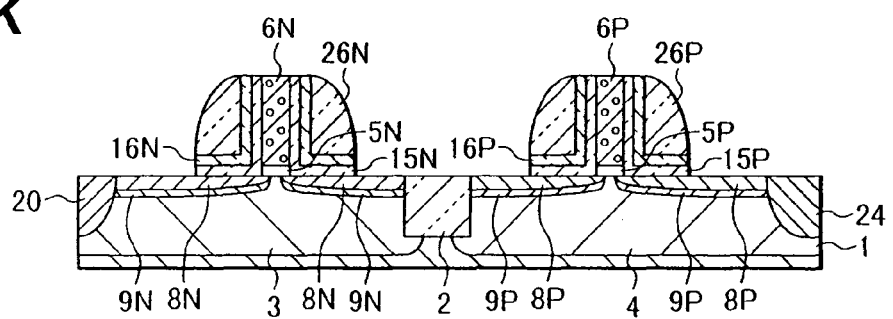
Figure 1L:
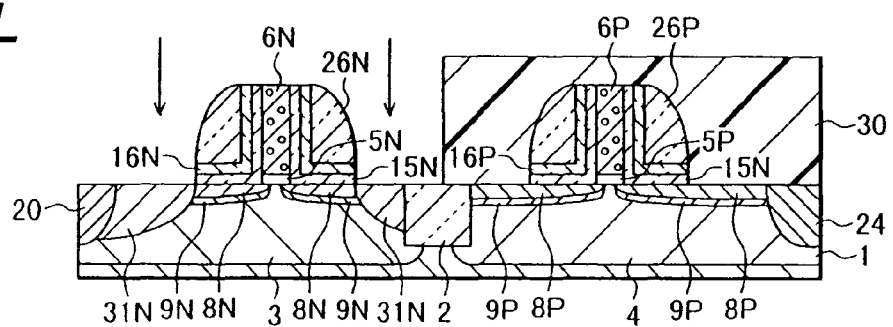
Figure 1M:
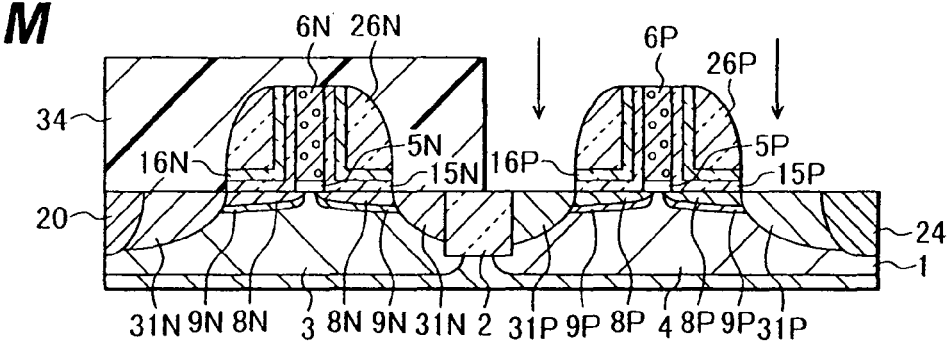
Figure 1N:
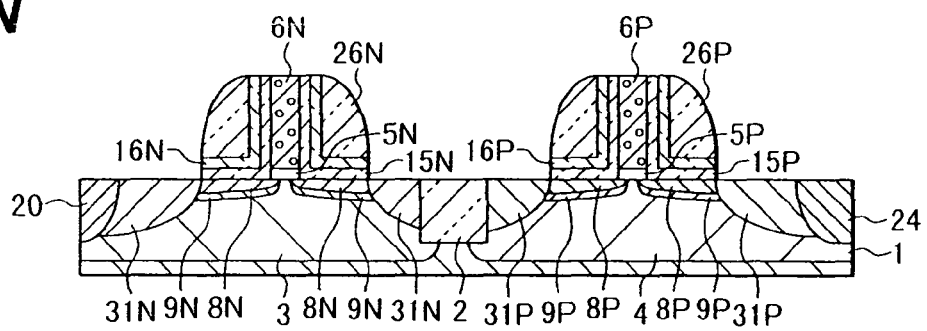
Figure 1O:
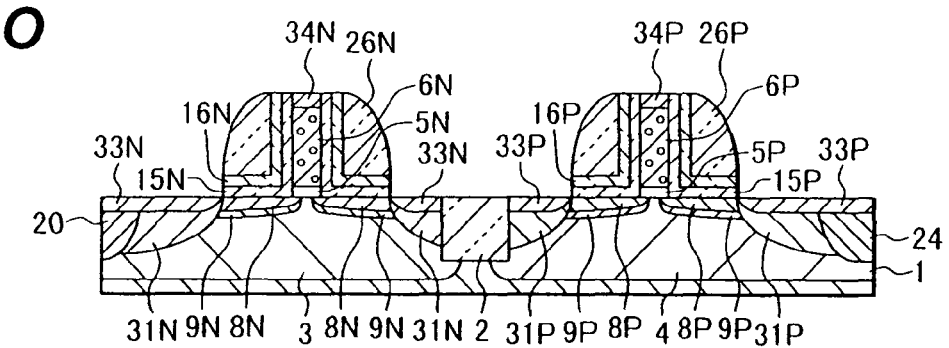

With reference to FIGS. 1A to 1O, a semiconductor device manufacturing method according to the first embodiment of the invention will be described.

As shown in FIG. 1A, in a surface layer of a silicon substrate 1, an element separation insulating film 2 of silicon oxide is formed by known shallow trench isolation technique. Active regions are defined by the element separation insulating film 2. A p-type well 3 is formed in the area where an n-channel MOS FET is to be formed, and an n-type well 4 is formed in the area where a p-channel MOSFET is to be formed.

On the surface of the substrate 1, a silicon oxynitride (SiON) film having a thickness of 1.2 nm is formed. The SiON film is formed by forming a silicon oxide film by thermally oxidizing the surface of the substrate 1 and thereafter annealing the silicon oxide film in a nitrogen atmosphere. On this SiON film, a non-doped polysilicon film having a thickness of 110 nm is formed by chemical vapor deposition (CVD).

The surface of the polysilicon film is covered with a resist pattern to etch the polysilicon film. On the surface of the p-type well 3, a gate electrode 6N made of polysilicon is left, and on the surface of the n-type well 4, a gate electrode 6P made of polysilicon is left. Etching the polysilicon film may be performed by reactive ion etching using HBr and $O_2$. The gate length is, for example, 40 to 100 nm. Since impurity is not implanted in the polysilicon film, it is possible to suppress variations of the cross sectional shapes of the gate electrodes 6N and 6P.

After the gate electrodes 6N and 6P are formed, the resist pattern is removed. At this time, the SiON film not covered with the gate electrodes 6N and 6P is removed.

As shown in FIG. 1B, the area where the n-type well 4 is formed is covered with a resist pattern 7. By using the gate electrode 6N as a mask, arsenic (As) ions are implanted into a surface layer of the p-type well 3 under the conditions of an acceleration energy of 5 keV and a dose of $1 \times 10^{15}$ cm$^{-2}$. An ion beam is inclined from the substrate normal direction toward the gate length direction (carrier motion direction) and has an incidence angle of 0 to 7°. This arsenic ion implantation forms n-type extension regions 8N of the source and drain regions.

Next, by using the gate electrode 6N as a mask, boron (B) ions are implanted into the surface layer of the p-type well 3 under the conditions of an acceleration energy of 9 keV and a dose of $4 \times 10^{14}$ cm$^{-2}$. An ion beam is inclined from the substrate normal direction toward the gate length direction and has an incidence angle of 15 to 30°. This boron ion implantation forms p-type pocket regions 9N. After ion implantation, the resist pattern 7 is removed.

As shown in FIG. 1C, the area where the p-type well 3 is formed is covered with a resist pattern 11. By using the gate electrode 6P as a mask, B ions are implanted into a surface layer of the n-type well 4 under the conditions of an acceleration energy of 0.5 keV and a dose of $8 \times 10^{14}$ cm$^{-2}$. An ion beam is inclined from the substrate normal direction toward the gate length direction and has an incidence angle of 0 to 7°. This B ion implantation forms p-type extension regions 8P of the source and drain regions.

Next, by using the gate electrode 6P as a mask, As ions are implanted into the surface layer of the n-type well 4 under the conditions of an acceleration energy of 60 keV and a dose of $4 \times 10^{14}$ cm$^{-2}$. An ion beam is inclined from the substrate normal direction toward the gate length direction and has an incidence angle of 15 to 30°. This As ion implantation forms n-type pocket regions 9P. After ion implantation, the resist pattern 11 is removed.

As shown in FIG. 1D, a silicon oxide film 15 having a thickness of 10 to 20 nm is formed on or over the surfaces of the gate electrodes 6N and 6P and substrate 1 by CVD. On or over the surface of the silicon oxide film 15, a silicon nitride film 16 having a thickness of 20 nm is formed by CVD.

As shown in FIG. 1E, on or over the surface of the silicon nitride film 16, a thick silicon oxide film 17 having a thickness of 100 to 300 nm is formed by CVD. As shown in FIG. 1F, the thick silicon oxide film 17 is anisotropically etched to leave a mask member 17a of silicon oxide on the sidewalls of the gate electrode 6N and a mask member 17b of silicon oxide on the sidewalls of the gate electrode 6P. As viewed along a direction parallel to the normal direction of the substrate 1, the mask member 17a is disposed on or over a ring area surrounding the gate electrode 6N of the surface of the substrate 1. Similarly, the mask member 17b is disposed on a ring area surrounding the gate electrode 6P of the surface of the substrate 1.

As shown in FIG. 1G, the area where the n-type well 4 is formed is covered with a resist pattern 19. P ions are implanted into the gate electrode 6N under the conditions of acceleration energy of 8 keV and a dose of $7\times10^{15}$ cm$^{-2}$. Since the substrate surface layer near the gate electrode 6N is covered with the mask member 17a, P ions are not implanted into the substrate surface layer near the gate electrode. In the p-type well 3 in the region not covered with the mask member 17a, a high impurity concentration region 20 doped with P ions is formed. After P ions are implanted, the resist pattern 19 is removed.

As shown in FIG. 1H, the area where the p-type well 3 is formed is covered with a resist pattern 23. B ions are implanted into the gate electrode 6P under the conditions of acceleration energy of 3 keV and a dose of $4\times10^{15}$ cm$^{-2}$. Since the substrate surface layer near the gate electrode 6P is covered with the mask member 17b, B ions are not implanted into the substrate surface layer near the gate electrode. In the n-type well 4 in the region not covered with the mask member 17b, a high impurity concentration region 24 doped with B ions is formed. After B ions are implanted, the resist pattern 23 is removed.

As shown in FIG. 1I, the mask members 17a and 17b shown in FIG. 1H are removed by hydrofluoric acid (HF). Since the element separation insulating film 2 of silicon oxide is covered with the silicon nitride film 16, the surface layer of the element separation insulating film 2 can be prevented from being etched by HF.

As shown in FIG. 1J, on or over the surface of the silicon nitride film 16, an insulating film 26 of silicon oxide is deposited to a thickness of 80 nm by CVD. This insulating film 26 may be made of silicon nitride.

As shown in FIG. 1K, the silicon oxide film 15, silicon nitride film 16 and insulating film 26 shown in FIG. 1J are anisotropically etched. As viewed along a direction in parallel to the substrate normal, a silicon oxide film 15N is left in a ring area adjacent to and surrounding the gate electrode 6N and on the sidewalls of the gate electrode 6N. The silicon oxide film 15N is conformal to the underlying surface.

On the surface of the silicon oxide film 15N, a silicon nitride film 16N is left. The silicon nitride film 16N is also conformal to the underlying surface. On the surface of the silicon nitride film 16N, sidewall spacers 26N of silicon oxide are left. Also in the area where the n-type well 4 is formed, a silicon oxide film 15P, a silicon nitride film 16P and sidewall spacers 26P are left.

As shown in FIG. 1L, the area where the n-type well 4 is formed is covered with a resist pattern 30. By using as a mask the gate electrode 6N, silicon oxide film 15N, silicon nitride film 16N and sidewall spacers 26N, P ions are implanted into the surface layer of the p-type well 3 under the conditions of an acceleration energy of 8 keV and a dose of $2\times10^{15}$ cm$^{-2}$. P ion implantation forms source and drain regions 31N. In this case, P ions are also implanted into the gate electrode 6N. A total dose of P ions into the gate electrode 6N is therefore $9\times10^{15}$ cm$^{-2}$. After P ion implantation, the resist pattern 30 is removed.

As shown in FIG. 1M, the area where the p-type well 3 is formed is covered with a resist pattern 34. B ions are implanted into the surface layer of the n-type well 4 under the conditions of an acceleration energy of 3 keV and a dose of $2\times10^{15}$ cm$^{-2}$. P ion implantation forms source and drain regions 31P. In this case, B ions are also implanted into the gate electrode 6P. A total dose of B ions into the gate electrode 6P is therefore $6\times10^{15}$ cm$^{-2}$.

As shown in FIG. 1N, the resist pattern 34 shown in FIG. 1M is removed. A heat treatment is performed for 3 seconds at 1050° C. to activate implanted impurity ions.

The processes up to the state shown in FIG. 1O will be described. A cobalt (Co) film is formed on the surfaces of the gate electrodes 6N and 6P, sidewall spacers 26N and 26P and substrate 1. A heat treatment is performed to proceed a silicide reaction between the Co film and silicon. A cobalt silicide (CoSi) film 33N is therefore formed on the surfaces of the source and drain regions 31N and n-type high impurity concentration region 20, and a CoSi film 34N is formed on the upper surface of the gate electrode 6N. Similarly, a cobalt silicide (CoSi$_2$) film 33P is formed on the surfaces of the source and drain regions 31P and p-type high impurity concentration region 24, and a CoSi$_2$ film 34P is formed on the upper surface of the gate electrode 6P. After the silicide reaction, an unreacted Co film is removed.

In the first embodiment described above, in the processes shown in FIGS. 1G and 1H, ions are implanted into the gate electrodes 6N and 6P. During these processes, since the source and drain regions are maintained covered with the mask members 17a and 17b, although the impurities are implanted into the gate electrodes 6N and 6P, they are not implanted into the source and drain regions. It is therefore possible to set the impurity concentration of the gate electrodes 6N and 6P independently from that of the source and drain regions.

Although the high impurity concentration regions 20 and 24 in the areas not covered with the mask members 17a and 17b are formed, these high impurity concentration regions are sufficiently remote from the gate electrodes 6N and 6P so that the operation of MOSFETs are not adversely affected.

The sidewalls of the gate electrodes 6N and 6P are covered with the silicon oxide films 15N and 15P as shown in FIG. 1O. Since the dielectric constant of silicon oxide is lower than that of silicon nitride, parasitic capacitance between the gate electrode 6N and extension regions 8N and between the gate electrode 6P and extension regions 8P can be reduced more than the case wherein the silicon nitride films 16N and 16P are in direct contact with the sidewalls of the gate electrodes 6N and 6P.

Figure 2A:
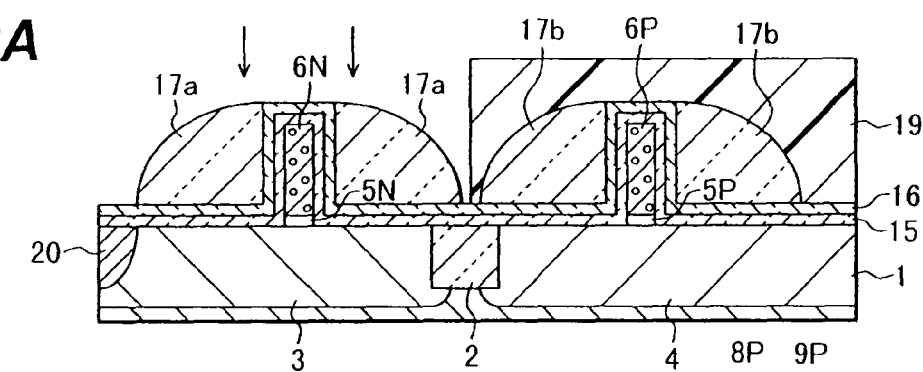
FIGS. 2A to 2N are cross sectional views of a substrate illustrating a semiconductor device manufacturing method according to a second embodiment of the invention.

With reference to FIGS. 2A to 2N, a semiconductor device manufacturing method according to the second embodiment of the invention will be described.

The processes up to the state shown in FIG. 2A will be described. The structure shown in FIG. 2A corresponds to the structure shown in FIG. 1G of the first embodiment with the extension regions 8N and 8P and pocket regions 9N and 9P being removed. The structure shown in FIG. 2A can be formed by omitting the ion implantation process shown in FIG. 1B for forming the extension regions 8N and pocket regions 9N and the ion implantation process shown in FIG. 1C for forming the extension regions 8P and pocket regions 9P. Similar to the first embodiment, after P ions are implanted into the gate electrode 6N, the resist pattern 19 is removed.

Figure 2B:
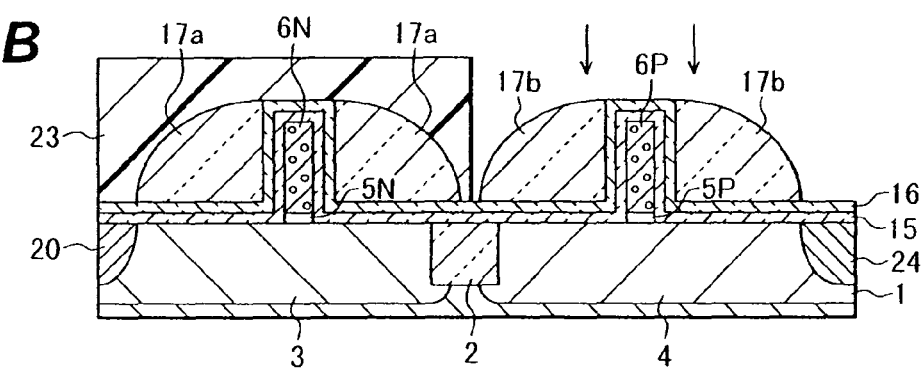

As shown in FIG. 2B, the area where the p-type well 3 is formed is covered with a resist pattern 23, and B ions are implanted into the gate electrode 6P. The ion implantation conditions are the same as those for B ions of the first embodiment described with FIG. 1H. After B ions are implanted, the resist pattern 23 is removed.

Figure 2C:
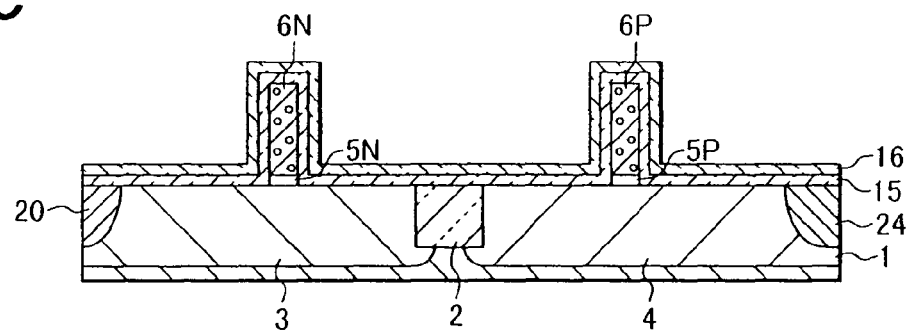

As shown in FIG. 2C, the mask members 17a and 17b shown in FIG. 2B are removed by hydrofluoric acid (HF). Since the element separation insulating film 2 of silicon oxide is covered with the silicon nitride film 16, the surface layer of the element separation insulating film 2 is prevented from being etched by hydrofluoric acid.

Figure 2D:
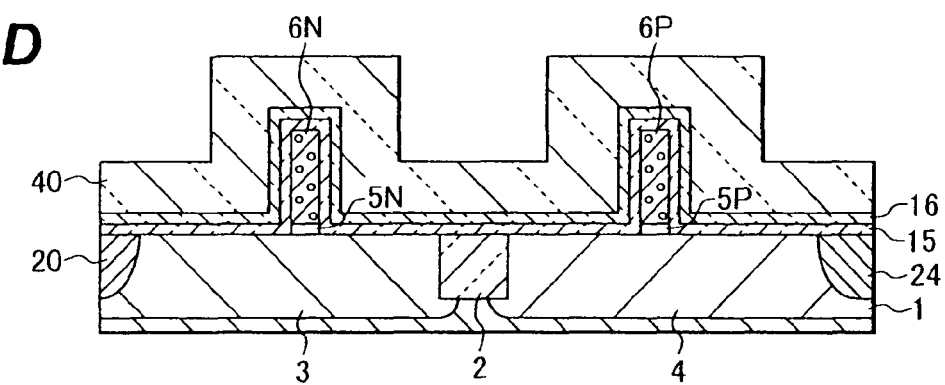

As shown in FIG. 2D, a silicon nitride film 40 is deposited on or over the silicon nitride film 16 to a thickness of 80 nm by CVD.

Figure 2E:
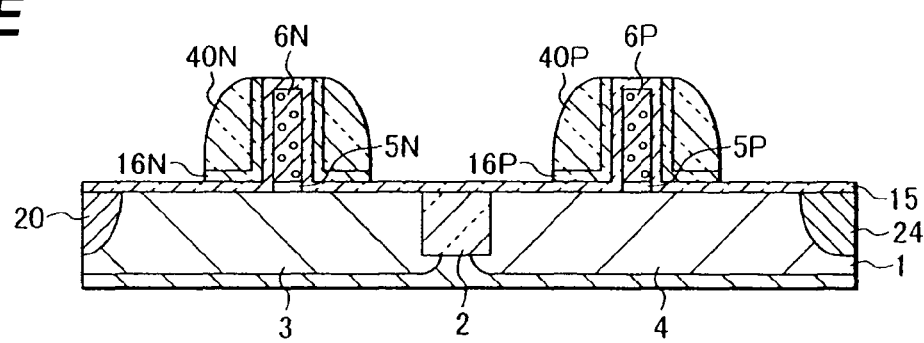

As shown in FIG. 2E, the silicon nitride films 40 and 16 shown in FIG. 2D are anisotropically etched to leave silicon nitride films 16N and 40N on the sidewalls of the gate electrode 6N and silicon nitride films 16P and 40P on the sidewalls of the gate electrode 6P. The silicon nitride films 40N and 40P are disposed on or over the surface of the substrate 1 in an area narrower than the area where the mask members 17a and 17b shown in FIG. 2A are disposed.

Figure 2F:
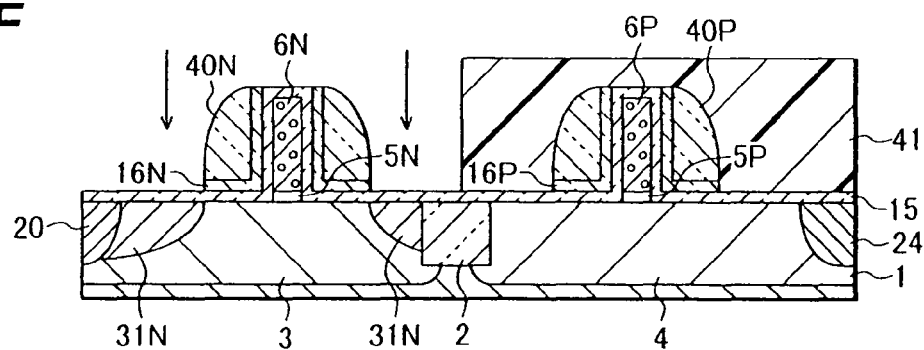

As shown in FIG. 2F, the area where the n-type well 4 is formed is covered with a resist pattern 41, and P ions are implanted into the surface layer of the p-type well 3 by using as a mask the gate electrode 6N and silicon nitride films 16N and 40N. This P ion implantation forms source and drain regions 31N. The ion implantation conditions are the same as those of P ions for forming the source and drain regions 31N of the first embodiment described with reference to FIG. 1L. In this case, P ions are implanted also into the gate electrode 6N. After P ions are implanted, the resist pattern 41 is removed.

Figure 2G:
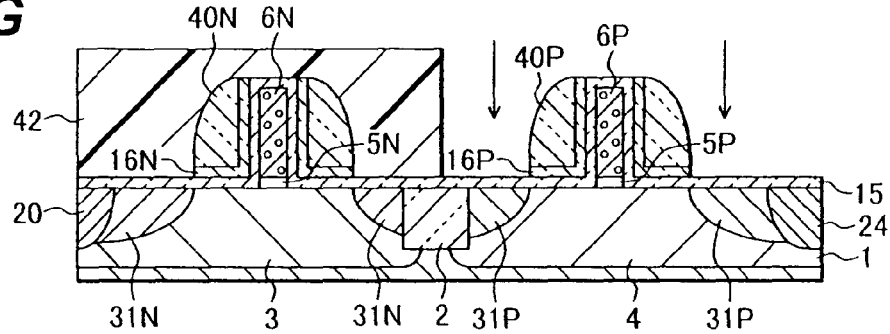

As shown in FIG. 2G, the area where the p-type well 3 is formed is covered with a resist pattern 42, and B ions are implanted into the surface layer of the n-type well 4 by using as a mask the gate electrode 6P and silicon nitride films 16P and 40P. This B ion implantation forms source and drain regions 31P. The ion implantation conditions are the same as those of B ions for forming the source and drain regions 31P of the first embodiment described with reference to FIG. 1M. In this case, B ions are implanted also into the gate electrode 6P.

Figure 2H:
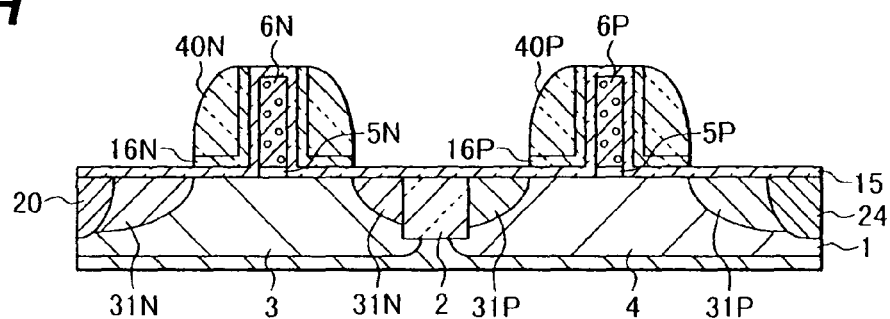

As shown in FIG. 2H, the resist pattern 42 shown in FIG. 2G is removed. A heat treatment is performed for 3 seconds at 1000° C. to activate implanted impurity ions.

Figure 2I:
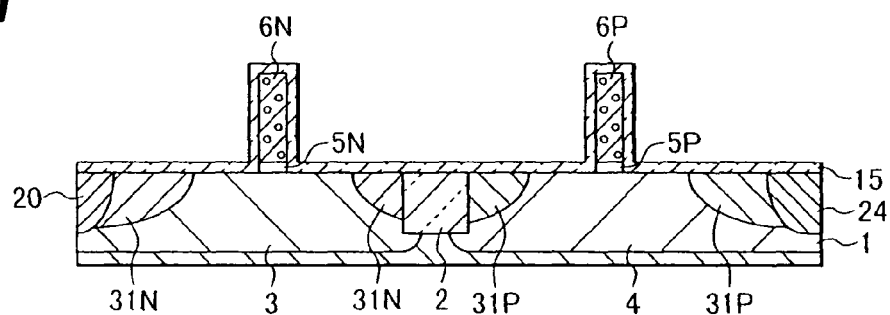

As shown in FIG. 2I, the silicon nitride films 16N, 16P, 40N and 40P shown in FIG. 2H are etched and removed by phosphoric acid.

Figure 2J:
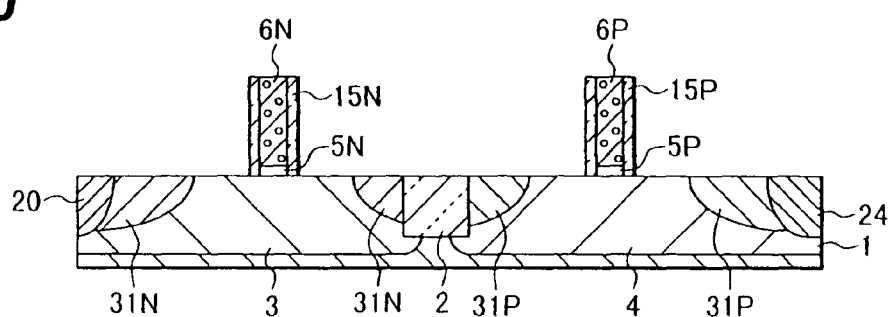

As shown in FIG. 2J, the silicon oxide film 15 shown in FIG. 2I is anisotropically etched. Sidewall spacers 15N of silicon oxide are left on the sidewalls of the gate electrode 6N, and sidewall spacers 15P are left on the sidewalls of the gate electrode 6P.

As shown in FIG. 2K, the area where the n-type well 4 is formed is covered with a resist pattern 45. By using the gate electrode 6N and sidewall spacers 15N as a mask, As ions are implanted to form extension regions 8N and B ions are implanted to form pocket regions 9N. These ion implantation conditions are the same as those for forming the extension regions 8N and pocket regions 9N of the first embodiment described with the process shown in FIG. 1B. After ion implantation, the resist pattern 45 is removed.

As shown in FIG. 2L, the area where the p-type well 3 is formed is covered with a resist pattern 46. By using the gate electrode 6P and sidewall spacers 15P as a mask, B ions are implanted to form extension regions 8P and P ions are implanted to form pocket regions 9P. These ion implantation conditions are the same as those for forming the extension regions 8P and pocket regions 9P of the first embodiment described with the process shown in FIG. 1C. After ion implantation, the resist pattern 46 is removed.

A heat treatment is performed for a very short time at 1050° C. to activate impurity ions implanted into the extension regions 8N and 8P and pocket regions 9N and 9P. This heat treatment time is sufficiently shorter than the heat treatment time (3 seconds) for activating the impurities implanted into the source and drain regions 31N and 31P. It is therefore possible to prevent the diffusion of impurities implanted into the extension regions 8N and 8P. The position at which the concentration distribution of impurities in the extension regions 8N and 8P in the depth direction takes a maximum value is shallower than that at which the concentration distribution of impurities in the source and drain regions 31N and 31P takes a maximum value.

As shown in FIG. 2M, sidewall spacers 47N of silicon nitride are formed on the outer sidewalls of the sidewall spacers 15N, at the same time when sidewall spacers 47P of silicon nitride are formed on the outer sidewalls of the sidewall spacers 15P. These sidewall spacers 47N and 47P can be formed by depositing a silicon nitride film having a thickness of 80 nm and thereafter anisotropically etching it.

The sidewall spacers 47N reach at least the boundaries of the source and drain regions 31N on the gate electrode 6N side. The sidewall spacers 47P reach at least the boundaries of the source and drain regions 31P on the gate electrode 6P side.

As shown in FIG. 2N, $CoSi_2$ films 33N, 33P, 34N and 34P are formed on the upper surfaces of the source and drain regions 31N, 31P and gate electrodes 6N and 6P. The process of forming the $CoSi_2$ films 33N, 33P, 34N and 34P is the same as that of forming the $CoSi_2$ films 33N, 33P, 34N and 34P of the first embodiment shown in FIG. 1O.

Similar to the first embodiment, also in the second embodiment, in the processes shown in FIGS. 2A and 2B, impurities are implanted only into the gate electrodes 6N and 6P without implanting impurities into the source and drain regions. It is therefore possible to set the impurity concentration of the gate electrodes 6N and 6P independently from that of the source and drain regions.

In the second embodiment, as shown in FIGS. 2K and 2L, ion implantation for forming the extension regions 8N and 8P is performed under the existence of the thin sidewall spacers 15N and 15P having a thickness in the order of 10 to 20 nm formed on the sidewalls of the gate electrodes 6N and 6P. It is therefore possible to prevent the ends of the extension regions 8N and 8P from entering farther under the gate electrodes 6N and 6P.

With reference to FIGS. 3A to 3M, a semiconductor device manufacturing method according to the third embodiment of the invention will be described.

Figure 3A:
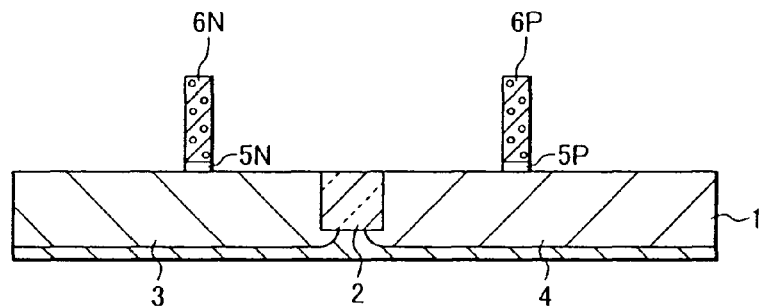
FIGS. 3A to 3M are cross sectional views of a substrate illustrating a semiconductor device manufacturing method according to a third embodiment of the invention.

The structure shown in FIG. 3A is the same as that of the first embodiment shown in FIG. 1A. By using processes similar to that of the first embodiment, the structure shown in FIG. 3A can be formed.

Figure 3B:
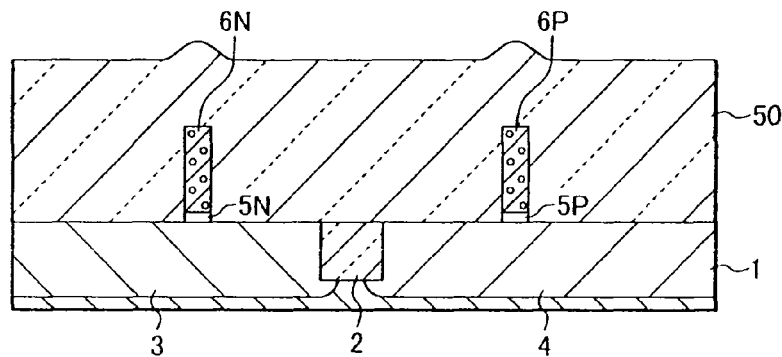

As shown in FIG. 3B, an insulating film 50 having a thickness of, for example, 200 nm is formed by a spin-on-glass method, burying the gate electrodes 6N and 6P.

Figure 3C:
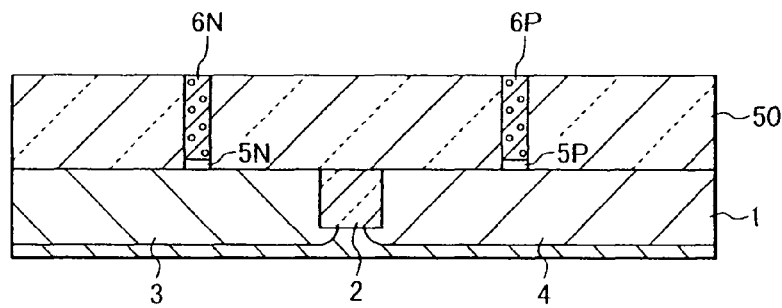

As shown in FIG. 3C, the insulating film 50 is subjected to chemical mechanical polishing (CMP) until the upper surfaces of the gate electrodes 6N and 6P are exposed. It is not necessarily required to completely expose the upper surfaces of the gate electrodes 6N and 6P, but a thin film may be left on the gate electrodes to such an extent that the thin film will not function as a mask during ion implantation. For example, a film on the gate electrodes 6N and 6P can be thinned to a desired thickness by making the surface of the insulating film 50 by CMP or etch-back flatter than the surface of the insulating film immediately after it was formed.

Figure 3D:
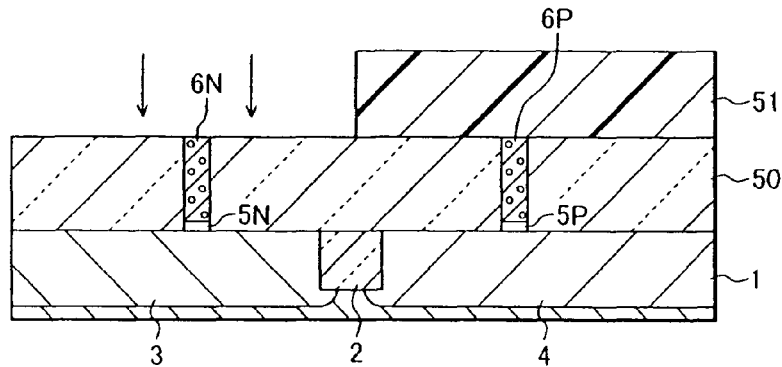

As shown in FIG. 3D, the surface area of the insulating film 50 above the n-type well 4 is covered with a resist pattern 51. It is not necessarily required to cover the whole area above the n-type well 4, but it is sufficient that at least the area above the gate electrode 6P is covered with the insulating film 51.

By using the resist pattern 51 as a mask, P ions are implanted into the gate electrode 6N. The P ion implantation conditions are the same as those for P ion implantation into the gate electrode 6N of the first embodiment process described with reference to FIG. 1G. Since the substrate surface near the gate electrode 6N is covered with the insulating film 50, P ions are not implanted into the surface layer of the substrate 1. After P ion implantation, the resist pattern 51 is removed.

Figure 3E:
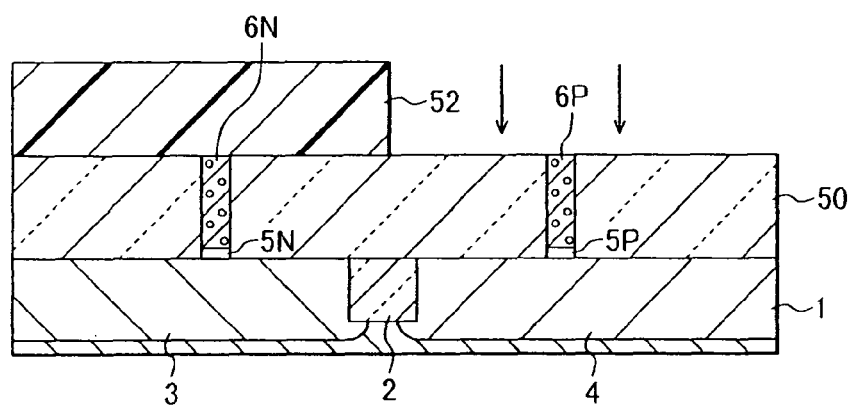

As shown in FIG. 3E, the surface area of the insulating film 50 above the p-type well 3 is covered with a resist pattern 52. It is sufficient that at least the area above the gate electrode 6N is covered with the insulating film 50. By using the resist pattern 52 as a mask, B ions are implanted into the gate electrode 6P. The B ion implantation conditions are the same as those for B ion implantation into the gate electrode 6P of the first embodiment process described with reference to FIG. 1H. Since the substrate surface near the gate electrode 6P is covered with the insulating film 50, B ions are not implanted into the surface layer of the substrate 1. After B ion implantation, the resist pattern 52 is removed.

Figure 3F:
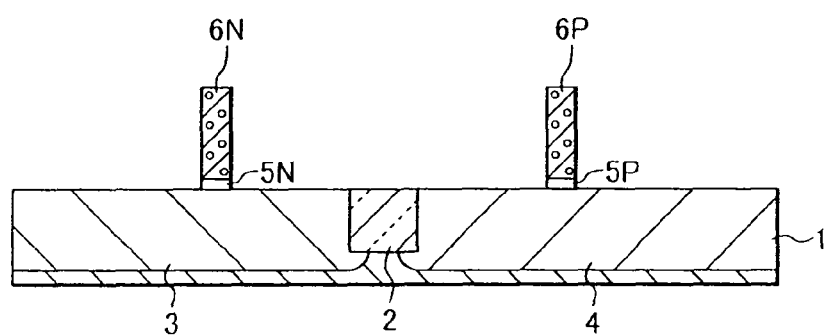

As shown in FIG. 3F, the insulating film 50 shown in FIG. 3E is removed by hydrofluoric acid. The insulating film 50 formed by SOG has an etching rate faster than the element separation insulating film 2. It is therefore expected that the element separation insulating film 2 is hardly thinned while the insulating film 50 is etched.

Figure 3G:
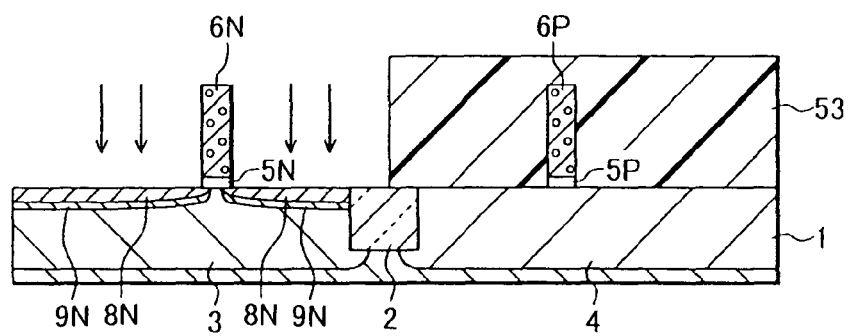

As shown in FIG. 3G, the area where the n-type well 4 is formed is covered with a resist pattern 53. By using the gate electrode 6N as a mask, As ions are implanted to form extension regions 8N and B ions are implanted to form pocket regions 9N. The ion implantation conditions are the same as those for forming the extension regions 8N and pocket regions 9N of the first embodiment described with reference to FIG. 1B. After ion implantation, the resist pattern 53 is removed.

Figure 3H:
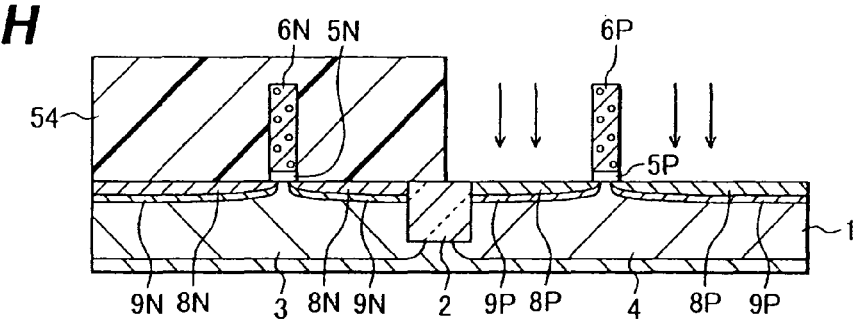

As shown in FIG. 3H, the area where the p-type well 3 is formed is covered with a resist pattern 54. By using the gate electrode 6P as a mask, B ions are implanted to form extension regions 8P and As ions are implanted to form pocket regions 9P. The ion implantation conditions are the same as those for forming the extension regions 8P and pocket regions 9P of the first embodiment described with reference to FIG. 1C. After ion implantation, the resist pattern 54 is removed.

Figure 3I:
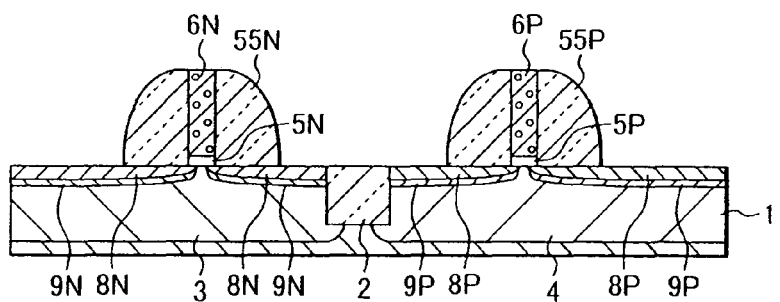

As shown in FIG. 3I, sidewall spacers 55N and 55P of silicon oxide or silicon nitride are formed on the sidewalls of the gate electrodes 6N and 6P. The sidewall spacers 55N and 55P are formed by a deposition process of a silicon oxide film or a silicon nitride film by CVD and an anisotropic etching process.

Figure 3J:
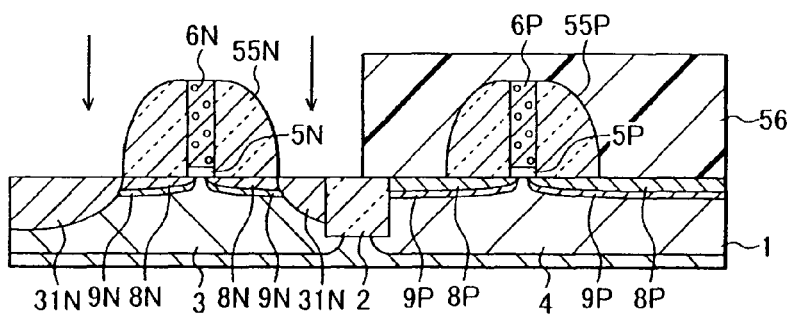

As shown in FIG. 3J, the area where the n-type well 4 is formed is covered with a resist pattern 56. By using as a mask the gate electrode 6N and sidewall spacers 55N, P ions are implanted to form source and drain regions 31N. The ion implantation conditions are the same as those for forming the source and drain regions 31N described with the first embodiment process shown in FIG. 1L. After P ion implantation, the resist pattern 56 is removed.

Figure 3K:
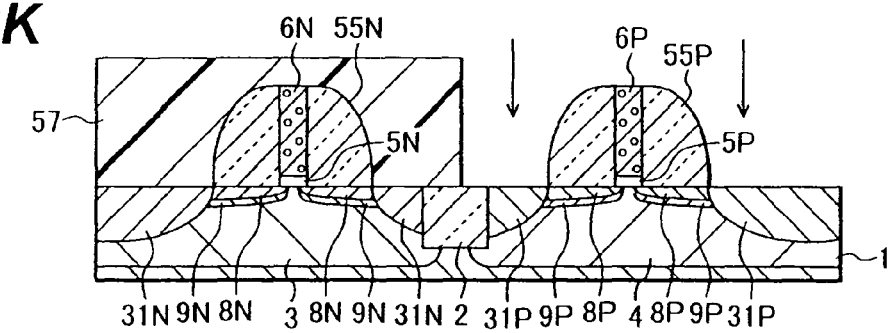

As shown in FIG. 3K, the area where the p-type well 3 is formed is covered with a resist pattern 57. By using as a mask the gate electrode 6P and sidewall spacers 55P, B ions are implanted to form source and drain regions 31P. The ion implantation conditions are the same as those for forming the source and drain regions 31P described with the first embodiment process shown in FIG. 1M.

Figure 3L:
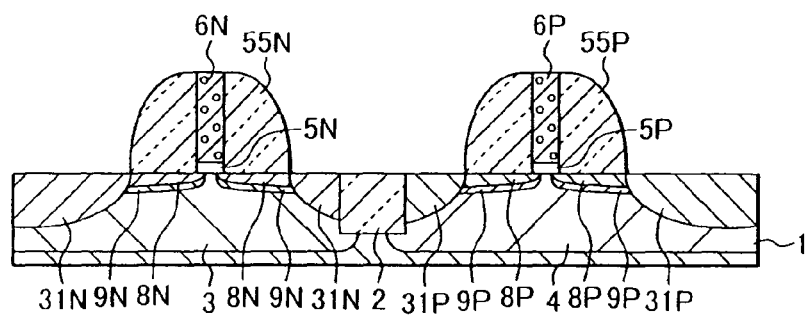

As shown in FIG. 3L, the resist pattern 57 shown in FIG. 3K is removed. A heat treatment is performed for about 3 seconds at a temperature of 1050° C. to activate implanted impurity ions.

Figure 3M:
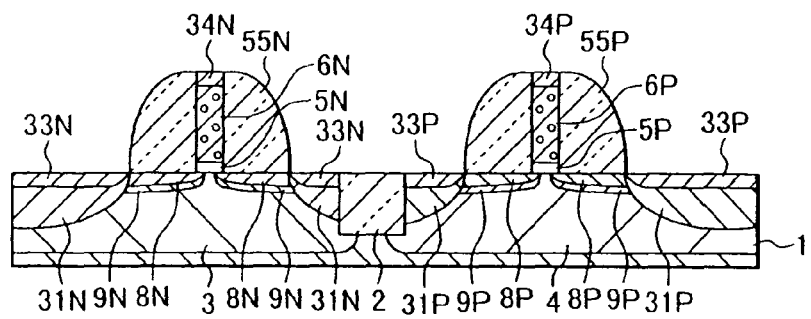

As shown in FIG. 3M, $CoSi_2$ films 33N are formed on the surfaces of the source and drain regions 31N and a $CoSi_2$ film 34N is formed on the upper surface of the gate electrode 6N, at the same time when $CoSi_2$ films 33P are formed on the surfaces of the source and drain regions 31P and a $CoSi_2$ film 34P is formed on the upper surface of the gate electrode 6P.

In the third embodiment, in the processes shown in FIGS. 3D and 3E, impurities are implanted into the gate electrodes 6N and 6P by masking the surface layer of the substrate with the insulating film 50. It is therefore possible to set the impurity concentration of the gate electrode independently from that of the source and drain regions.

In the third embodiment, in the process shown in FIG. 3B, although the surface of the substrate 1 is covered with the insulating film 50 formed by SOG, the surface of the substrate 1 may be covered with a resist film formed by spin-coating resist. After the surface of the substrate 1 is covered with the resist film, the surface of the resist film is planarized by CMP or etch-back to expose the upper surfaces of the gate electrodes 6N and 6P as shown in FIG. 3C.

Next, with reference to FIGS. 4A to 4H, a semiconductor device manufacturing method according to a fourth embodiment of the invention will be described. In FIGS. 4A to 4H, although the active region where a p-channel MOSFET is formed is shown, an n-channel MOSFET is formed in another active region not shown.

Figure 4A:
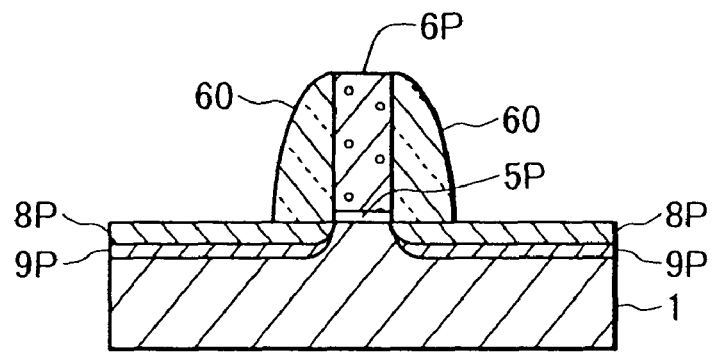
FIG. 4A to 4H are cross sectional views of a substrate illustrating a semiconductor device manufacturing method according to a fourth embodiment of the invention.

As shown in FIG. 4A, on and in the surface layer of a silicon substrate 1, a gate insulating film 5P, a gate electrode 6P, extension regions 8P and pocket regions 9P are formed. The processes up to this structure are the same as the p-channel MOSFET forming processes of the first embodiment shown in FIGS. 1A to 1C. For example, the height of the gate electrode 6P is 110 nm and the gate length is 40 nm. The processes of forming an n-channel MOSFET are also the same as the n-channel MOSFET forming processes of the first embodiment shown in FIGS. 1A and 1B.

A silicon nitride film is formed to a thickness of 40 to 100 nm by CVD, covering the whole surface of the substrate. The silicon nitride film is anisotropically etched to leave sidewall spacers 60 on the sidewalls of the gate electrode 6P.

Figure 4B:
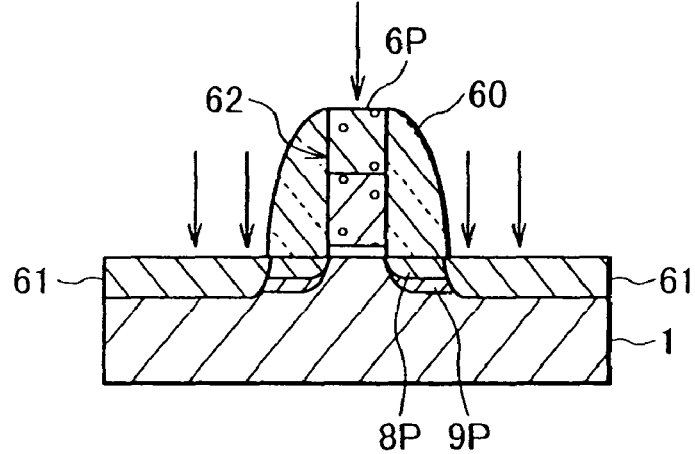

As shown in FIG. 4B, by using the gate electrode 6P and sidewall spacers 60 as a mask, boron (B) ions are implanted into the surface layer of the substrate 1 under the conditions of an acceleration energy of 1 to 2.5 keV and a dose of $2\times10^{15}$ $cm^{-2}$. Source and drain regions 61 are therefore formed in the substrate surface layer outside of the sidewall spacers 60, the source and drain regions being deeper than the extension regions 8P. During this process, although B ions are also implanted into the gate electrode 6P, a region 62 implanted with B ions is only an upper partial region of the gate electrode 6P and does not reach the bottom of the gate electrode. When an n-channel MOSFET is formed, phosphorous (P) ions are implanted, for example, under the conditions of an acceleration energy of 3 to 6 keV and a dose of $5\times10^{15}$ $cm^{-2}$.

Figure 4C:
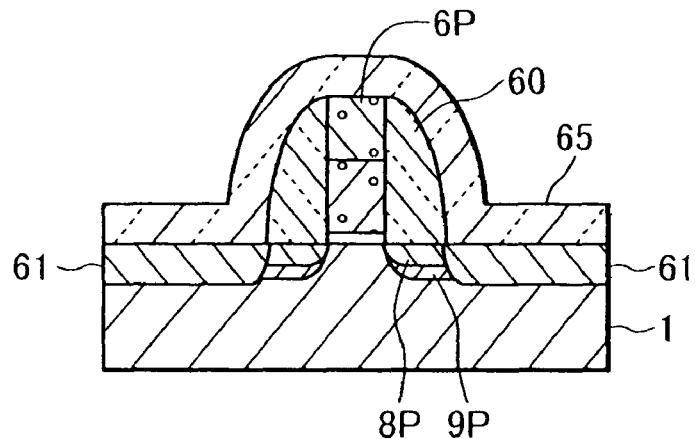

As shown in FIG. 4C, a silicon oxide film 65 is deposited on or over the whole surface of the substrate 1 to a thickness of 20 to 50 nm by CVD.

Figure 4D:
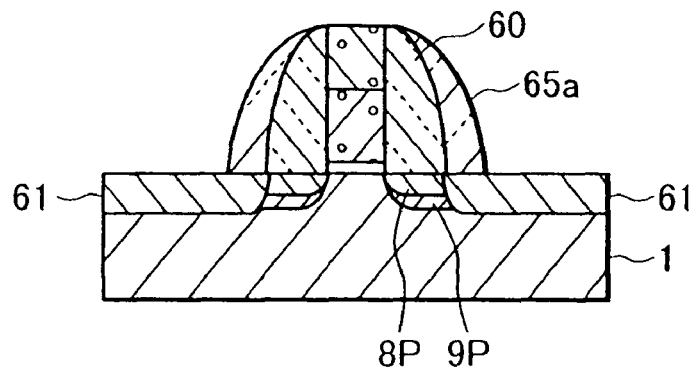

As shown in FIG. 4D, the silicon oxide film 65 is anisotropically etched to leave second layer sidewall spacers 65a on the first layer sidewall spacers 60.

Figure 4E:
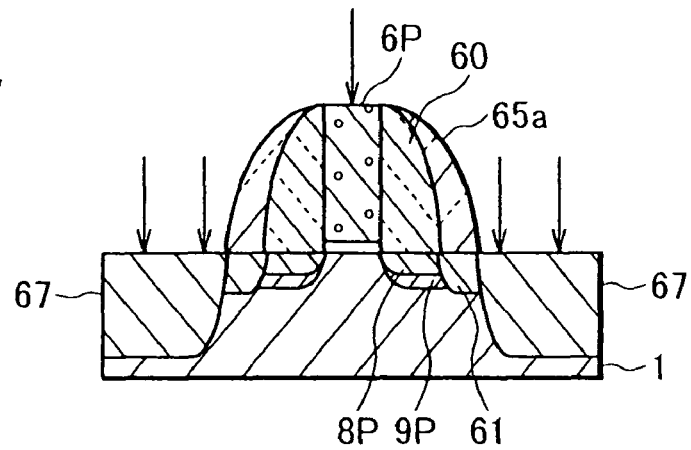

As shown in FIG. 4E, B ions are implanted into the gate electrode 6P under the conditions of an acceleration energy of 4 keV and a dose of $5\times10^{15}$ cm$^{-2}$. During this process, B ions are also implanted into the substrate surface layer outside of the second layer sidewall spacers 65a to form impurity diffusion regions 67. When an n-channel MOSFET is formed, P ions are implanted under the conditions of an acceleration energy of 10 keV and a dose of $8\times10^{15}$ cm$^{-2}$.

Figure 4F:
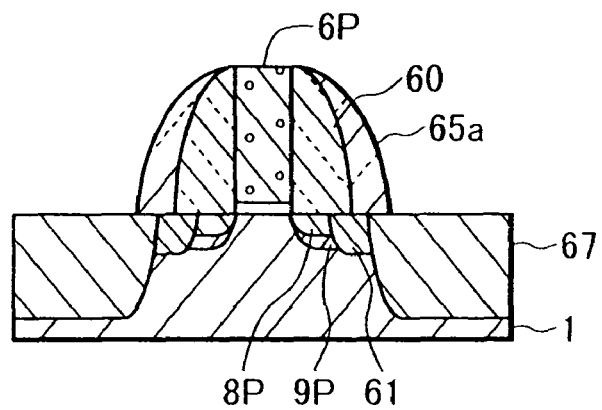

As shown in FIG. 4F, rapid thermal annealing (RTA) is performed at a temperature of 1050° C. Impurities implanted into the gate electrode 6P and substrate surface layer are therefore activated and diffused along the lateral and depth directions. The ends of the source and gate regions 61 on the gate electrode side enter the insides of the boundaries of the first layer sidewall spacers 60, and the ends of the impurity diffusion regions 67 on the gate electrode side enter the insides of the boundaries of the second layer sidewall spacers 65a. Therefore, the first layer sidewall spacers 60 reach halfway the upper surfaces of the source and drain regions, namely cover the partial upper surfaces of the source and drain regions 61.

Figure 4G:
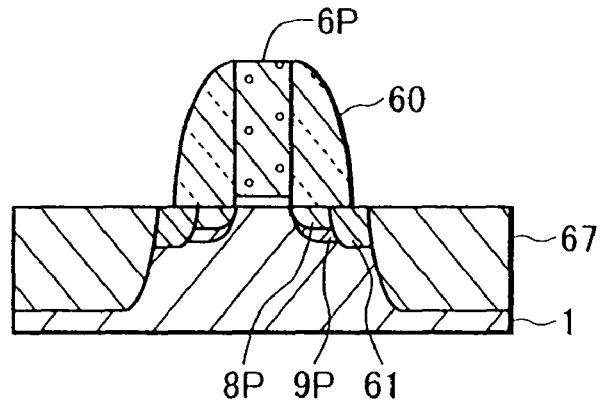

As shown in FIG. 4G, the second sidewall spacers 65a shown in FIG. 4F are removed. The second layer sidewall spacers 65a can be selectively removed by a wet process using hydrofluoric acid because the first layer sidewall spacers 60 are made of silicon nitride and the second layer sidewall spacers 65a are made of silicon oxide.

Figure 4H:
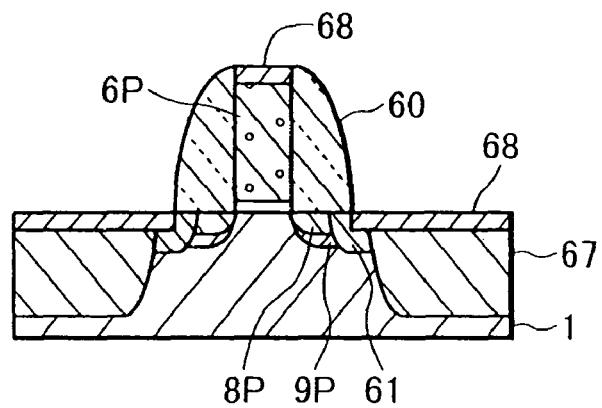
Figure 5A:
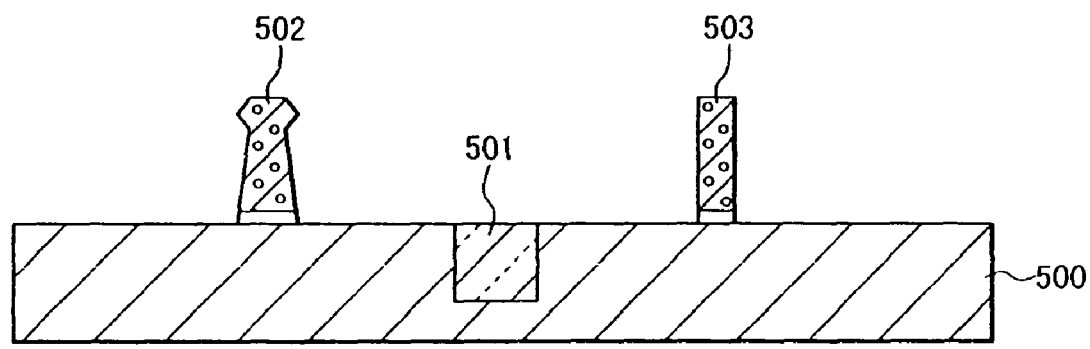
FIGS. 5A and 5B are cross sectional views showing examples of a gate electrode formed by a prior art method.
Figure 5B:
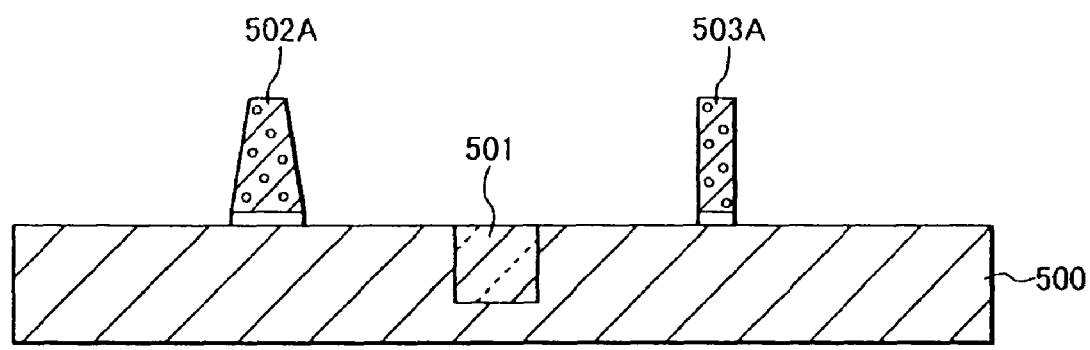

As shown in FIG. 4H, metal silicide films 68 of cobalt silicide or the like are formed on the gate electrode 6P and on the surface of the active region not covered with the gate electrode 6P and sidewall spacers 60. The metal silicide films 68 can be formed, for example, by depositing a cobalt film on or over the substrate whole surface, performing a heat treatment to silicidize cobalt, and thereafter removing an unreacted cobalt film.

Also in the fourth embodiment, since the gate electrode is formed by patterning a polysilicon film not implanted with impurities, a variation of the cross section of the gate electrode 6P can be suppressed. Impurities are not implanted to the bottom of the gate electrode 6P during the ion implantation process for the source and drain regions 61 shown in FIG. 4B, but are implanted to the deep region of the gate electrode 6P during the later process shown in FIG. 4E. Impurity ion implantation into the gate electrode 6P shown in FIG. 4E and heat treatment shown in FIG. 4F are preferably performed under the condition that impurities implanted into the gate electrode 6P reach the bottom of the gate electrodes 6P after the heat treatment. By performing the impurity ion implantation and heat treatment under this condition, depletion of the gate electrode 6P can be prevented.

The source and drain regions 61 are shallow as compared to the height of the gate electrode 6P. The acceleration energy for implanting impurity ions into the gate electrode 6P shown in FIG. 4E is therefore generally higher than the acceleration energy of impurity ion implantation for forming the source and drain regions 61 shown in FIG. 4B.

While impurities are implanted into the gate electrode 6P, the sidewalls of the gate electrode 6P have two layers of the sidewall spacers 60 and 65a which function as an ion implantation mask. Although the impurity diffusion regions 67 formed while impurities are implanted into the gate electrode are deeper than the source and drain regions 61, the impurity diffusion regions are remote from the channel just under the gate electrode 6P. The impurity diffusion regions 67 are therefore not likely to cause the punch-through phenomenon.

The total thickness of two layers of the sidewall spacers 60 and 65a necessary for preventing the punch-through phenomenon depends on the acceleration energy and dose when B ions are implanted into the gate electrode. If the acceleration energy is 4 keV and the dose is $1\times10^{15}$ cm$^{-2}$, $4\times10^{15}$ cm$^{-2}$, $8\times10^{15}$ cm$^{-2}$ or $1\times10^{16}$ cm$^{-2}$, then it is preferable to set the total thickness of two layers of the sidewall spacers 60 and 65a to 40 nm, 60 nm, 80 nm or 100 nm or thicker.

In the fourth embodiment, the first layer sidewall spacers 60 shown in FIG. 4F are made of silicon nitride and the second layer sidewall spacers 65a shown in FIG. 4F are made of silicon oxide. Since two layers of the sidewall spacers are made of insulating materials having different etching characteristics, only the second layer sidewall spacers 65a can be selectively removed.

If the second layer sidewall spacers 65a are made of silicon oxide, the second layer sidewall spacers 65a can be removed by a pre-treatment of the silicidation process shown in FIG. 4H. Therefore, without increasing the number of processes, the second layer sidewall spacers 65a can be removed.

In the fourth embodiment, the upper surface of the gate electrode 6P is exposed while impurities are implanted into the gate electrode 6P shown in FIG. 4E. If a film of silicon oxide, silicon nitride or the like is formed on the gate electrode, atoms (nitrogen, oxygen) in the film are diffused into the gate electrode in some cases by the knock-on phenomenon. In the fourth embodiment, it is possible to prevent unexpected impurities from being diffused into the gate electrode.

Also in the fourth embodiment, the sidewall spacers 60 formed on the extension regions 8P shown in FIG. 4A are left unetched. If the sidewall spacers 60 are to be removed, the surface layer of the extension region 8P is etched very slightly while the sidewall spacers 60 are removed. In such a case, this etch amount is required to be considered when the depth of the junction of the extension region 8P is controlled. In the fourth embodiment, since there is no process of etching the sidewall spacers 60, the depth of the extension region 8P can be controlled only by the impurity ion implantation conditions.

The silicon oxide film 65, which is formed by the process shown in FIG. 4C after the source and drain regions 61 are formed by the process shown in FIG. 4B, may be thinner than the first layer sidewall spacers 60. A thermal load applied to the source and drain regions 61 can therefore be mitigated and impurity re-diffusion can be suppressed. Since the re-diffusion of the source and drain regions 61 can be suppressed, it is possible to prevent the short channel effects The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device, comprising the steps of:
   (a) forming a gate electrode comprising semiconductor over a partial surface area of a semiconductor substrate;
   (b) forming a mask member over a surface of the semiconductor substrate over both sides of the gate electrode;
   (c) implanting impurities into the gate electrode after said (b) forming the mask member;
   (d) removing the mask member after said (c) implanting impurities;

(e) implanting impurities into a surface layer of the semiconductor substrate on both sides of the gate electrode to form source and drain regions after said (d) removing the mask member, wherein said step (e) includes the steps of:

(e1) forming first sidewall spacers on sidewalls of the gate electrode, said sidewall spacers being disposed in an area narrower than the surface of the semiconductor substrate which had been covered with the mask member;

(e2) implanting impurities into the surface layer of the semiconductor substrate by using the gate electrode and the first sidewall spacers as a mask;

(e3) removing the first sidewall spacers; and (e4) implanting impurities into the surface layer of the semiconductor substrate by using the gate electrode as a mask, under a condition that an impurity concentration distribution in a depth direction takes a maximum value at a position shallower than a position where an impurity concentration distribution of the impurities implanted at said step (e2) takes a maximum value;

after the step (e), forming second sidewall spacers on the sidewalls of the gate electrode, the second sidewall spacers reaching at least boundaries of areas implanted with the impurities in side step (e2); and after forming the second sidewall spacers, forming a metal silicide film on an upper surface of the gate electrode and on a surface of the areas implanted with the impurities in said step (e2) and not covered with the second sidewall spacers.

2. A method according to claim 1, further comprising:

before said step (a) a step of forming an element separation insulating film consisting of a first insulating material in the surface layer of the semiconductor substrate; and between said steps (a) and (b), a step (f) of covering surfaces of the gate electrode, the element separation insulating film and the semiconductor substrate with a second film consisting of a second insulating material, the second insulating material being different from the first insulating material and being the same as a material of the first sidewall spacers, wherein said step (e3) removes the first sidewall spacers and the second film.

3. A method according to claim 2, further comprising between said steps (a) and (f) a step (g) of covering the surfaces of the gate electrode, the element separation insulating film and the semiconductor substrate with a third film consisting of a third insulating material different from the second insulating material, wherein:

said step (f) forms the second film over the third film; and said step (e4) further includes a step of anisotropically etching the third film to remove the third film covering the surface of the semiconductor substrate on both sides of the gate electrode and leave the third film on the sidewalls of the gate electrode, and implants the impurities by using as a mask the gate electrode and the third film left on the sidewalls of the gate electrode.

4. The method of manufacturing a semiconductor device according to claim 1, wherein said step (b) comprises:

forming a mask film over the semiconductor substrate to cover the gate electrode; and anisotropically etching the mask film to leave the mask member.

5. The method of manufacturing a semiconductor device according to claim 3, wherein the thickness of the third film is 10 to 20 nm.

* * * * *